United States Patent
Sato et al.

(10) Patent No.: US 7,982,545 B2
(45) Date of Patent: Jul. 19, 2011

(54) TRANSMISSION APPARATUS AND METHOD OF SWITCHING PHASE LOCK REFERENCE FREQUENCY SIGNAL THEREOF

(75) Inventors: Tomoko Sato, Kawasaki (JP); Sunao Itou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 297 days.

(21) Appl. No.: 12/230,168

(22) Filed: Aug. 25, 2008

(65) Prior Publication Data

US 2009/0162072 A1 Jun. 25, 2009

(30) Foreign Application Priority Data

Dec. 21, 2007 (JP) ................................. 2007-330728

(51) Int. Cl.
*H03L 7/06* (2006.01)
(52) U.S. Cl. .......................................... 331/18; 331/25
(58) Field of Classification Search .................. 331/1 A, 331/8, 14, 18, 25, 49
See application file for complete search history.

(56) References Cited

U.S. PATENT DOCUMENTS 6,154,071 A * 11/2000 Nogawa ......................... 327/156

FOREIGN PATENT DOCUMENTS

JP 11-355259 12/1999
WO 00/18013 * 3/2000

* cited by examiner

*Primary Examiner* — David Mis
(74) *Attorney, Agent, or Firm* — Fujitsu Patent Center (57) ABSTRACT

An optical transmission apparatus according to the present invention connects a terminal apparatus side in which a transmission line is formed by, for example, SONET/SDH, and a WDM side in which a transmission line is formed by, for example, OTU3. The optical transmission apparatus according to the present invention includes a selector that, when an input signal is interrupted or switched, controls a PLL unit so as to switch and obtain a clock signal of a predetermined frequency oscillated by an OSC, corresponding to a frequency of a clock signal of the input signal before being divided to input into the PLL unit, as a clock signal to generate a PLL reference frequency.

6 Claims, 7 Drawing Sheets

TRANSMISSION APPARATUS AND METHOD OF SWITCHING PHASE LOCK REFERENCE FREQUENCY SIGNAL THEREOF

CROSS-REFERENCE TO RELATED APPLICATION(S)

This application is based upon and claims the benefit of priority of the prior Japanese Patent Application No. 2007-330728, filed on. Dec. 21, 2007, the entire contents of which are incorporated herein by reference.

BACKGROUND

1. Field

The present invention relates to a transmission apparatus for computer network communication that includes a phase locking unit, and a switching controlling unit, and a method of switching a phase lock reference frequency signal in the transmission apparatus.

2. Description of the Related Art

The importance of computer network communication such as the Internet has dramatically increased, and a further increase in communication speed of the computer network communication has been sought-after. For example, the Internet includes a backbone as a main transmission line, and in general, a broadband optical communication technology called a wavelength division multiplexing (WDM) has been used for the backbone.

The WDM is a technology that enables large capacity two-way high speed data communication, by multiplexing channels by transmitting light having different wavelengths on a single optical fiber. At present, a WDM with a transmission speed of 10 Gb/s and four multiplexed channels each with a transmission speed of 2.5 Gb/s at a wavelength is the mainstream.

Not only the optical communication, but every computer network communication is carried out with signals of a predetermined frequency. Transmission apparatuses such as a relay apparatus and a terminal apparatus in a communication network have a circuit called a phase-locked loop (PLL) that converts a frequency of a received signal to output a properly synchronized frequency signal by causing a frequency of an output signal matched to a frequency of an input signal or a reference frequency.

If the predetermined frequency of the communication needs to be changed over for some reason, a clock cross-connect distribution apparatus as proposed in Japanese Patent Application Laid-open No. H11-355259, for example, may be employed. The proposed clock cross-connect distribution apparatus can reduce the downtime and enables speedy recovery at the clock switching of an information processing apparatus, which employs a duplexed clock in a cross-connected manner, by using a low-frequency clock to switch a cross-connect-clock between the information processing apparatuses, and increasing the frequency of the clock supplied to each processing unit of the information processing apparatus after the clock switching.

However, a further increase in transmission speed in recent years gradually makes the conventional technique represented by that disclosed in the Japanese Patent Application Laid-open No. H11-355259 incapable of reducing the downtime and recovering speedily. On the other hand, an increased transmission speed is sought-after for the WDM. For example, an optical communication technology called a dense wavelength division multiplexing (DWDM) allows still larger capacity two-way high speed data communication by increasing the number of wavelengths to be multiplexed and by narrowing the channel interval.

The optical communication technology such as the DWDM is internationally-standardized as OTU3 of Optical Transport Network (OTN, an optical transmission standard recommended by the International Telecommunication Union Telecommunication Standardization Sector (ITU-T) in 2000), which is an optical communication network standard, and able to realize a transmission speed of 40 Gb/s.

In the optical communication technology with the transmission speed of 40 Gb/s, the PLL of the transmission apparatus changes a PLL reference clock to a clock of an internal oscillator, when an optical signal input into the transmission apparatus is interrupted. However, because of the high speed of 40 Gb/s, even a little switching time is a long time relative to the transmission speed, and significantly increases the number of error bits in the optical signal. The same applies when the optical signal is input and recovered.

SUMMARY

It is an object of the present invention to at least partially solve the problems in the conventional technology.

According to one aspect of the present invention, a transmission apparatus for computer network communication, includes: a phase locking unit that phase locks between an input signal and an output signal corresponding to the input signal based on a reference frequency signal determined by a clock signal obtained; an internal fixed frequency oscillator that oscillates a clock signal of a predetermined frequency; and a switching controlling unit that, when the input signal is interrupted or switched, controls the phase locking unit so as to obtain the clock signal by switching the clock signal obtained from a clock signal of the input signal before frequency division for input into the phase locking unit, to the clock signal oscillated by the internal fixed frequency oscillator.

According to another aspect of the present invention, a method of switching a phase lock reference frequency signal in a transmission apparatus, includes phase locking between an input signal and an output signal corresponding to the input signal based on a reference frequency signal determined by a clock signal obtained, oscillating a clock signal of a predetermined frequency to generate the reference frequency signal, and controlling, when the input signal is interrupted or switched, to switch the clock signal obtained in the phase locking from a clock signal of the input signal before frequency division for the phase locking, to the clock signal oscillated in the oscillating

DETAILED DESCRIPTION OF THE PREFERRED EMBODIMENTS

A first embodiment and a second embodiment of a transmission apparatus and a method of switching a phase lock reference frequency signal thereof according to the present invention will be described in detail below with reference to the accompanying drawings. The transmission apparatus according to the first embodiment and the second embodiment is an optical transmission apparatus that connects a terminal apparatus side in which a transmission line is formed by Synchronous optical networking/Synchronous Digital Hierarchy (SONET/SDH) with a transmission rate of 39.813 Gb/s of an optical carrier (OC) 768 or a synchronous transport module (STM) –256, and a WDM side in which a transmission line is formed by OTU3 with a transmission rate of 43.018 Gb/s.

The present invention, however, is widely and generally applicable to any transmission apparatus that includes a PLL, and its application is not limited to the optical transmission apparatus that connects the terminal apparatus side whose transmission line is formed by the SONET/SDH with the WDM side whose transmission line is formed by the OTU3.

Conventionally, in the optical transmission apparatus, a WDM apparatus that digitally wraps communication data switches a PLL reference clock at a phase comparison frequency of a PLL. The phase comparison frequency should be a common factor of transmission rates of an input signal and an output signal. More specifically, with a WDM apparatus whose transmission rate is 40 Gb/s, the transmission rate increases from OC768/STM-256 to OTU3. Accordingly, the phase comparison frequency is approximately 658 kilohertz, which is a common factor of each transmission rate.

Because a transmission line clock of OC768/STM-256 is 39.813 Gb/s, the phase comparison frequency is represented by 39.813 Gb/s÷60416=658 kilohertz. Because a transmission line clock of OTU3 (clock oscillated by a voltage controlled crystal oscillator (VCXO) of PLL) is 43.018 Gb/s, the phase comparison frequency is represented by 43.018 Gb/s÷65280=658 kilohertz. Accordingly, the phase comparison frequencies of the both transmission lines coincide.

A wavelength division multiplexing (WDM) system of the present invention relates to an optical transmission apparatus that uses the digital wrapper defined in ITU-T G.709 (interfaces for the optical transport network (OTN)).

Figure 1:
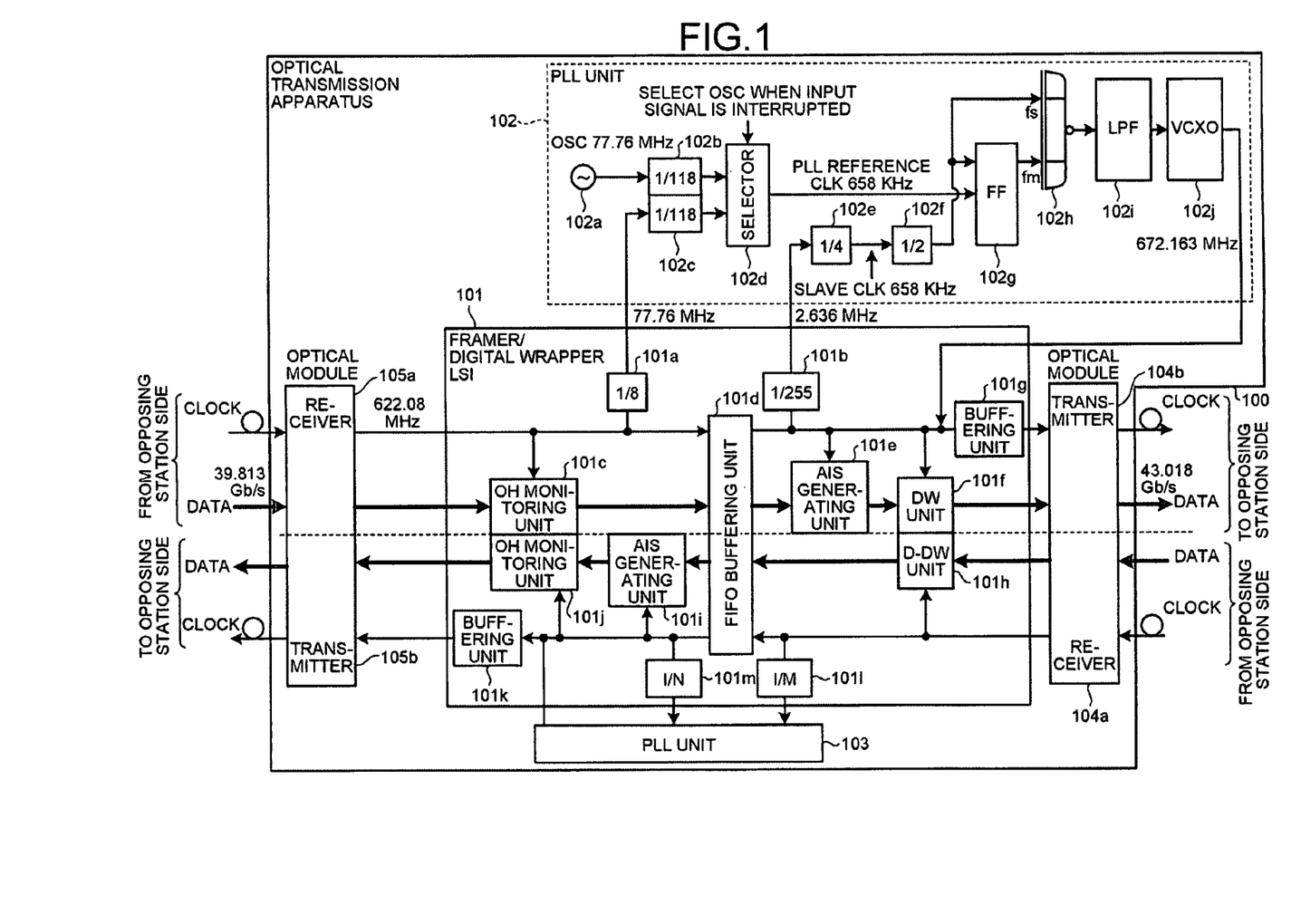
FIG. 1 is a functional block diagram of a conventional optical transmission apparatus.

A configuration of a conventional optical transmission apparatus that connects the SONET/SDH and the OTU3, and problems thereof will be explained at first, before explaining the first embodiment and the second embodiment. FIG. 1 is a functional block diagram of the conventional optical transmission apparatus.

As shown in FIG. 1, a conventional optical transmission apparatus 100 includes a framer/digital wrapper LSI 101, a PLL unit 102, a PLL unit 103 configured the same as the PLL unit 102, a receiver optical module 104a that is an interface to receive optical communication data from an opposing station side, which is another optical transmission apparatus 100, and convert the optical communication data into telecommunication data, and a transmitter optical module 104b that is an interface to convert the telecommunication data into optical communication data for transmitting to the opposing station side, which is another optical transmission apparatus 100. The conventional optical transmission apparatus 100 further includes a receiver optical module 105a that is an interface to receive optical communication data from a terminal apparatus side and convert the optical communication data into telecommunication data, and a transmitter optical module 105b that is an interface to convert the telecommunication data into the optical communication data for transmitting to the terminal apparatus side.

The optical communication data and a clock signal received at the receiver optical module 105a at a transmission rate of 39.813 Gb/s from the terminal apparatus side are subjected to frequency division when converted into telecommunication data at the receiver optical module 105a, and the transmission rate thereof is changed to 622.08 megahertz. The telecommunication data and the clock signal with the transmission rate of 622.08 megahertz are input into the framer/digital wrapper LSI 101.

The framer/digital wrapper LSI 101 includes a frequency divider 101a that processes the clock signal from the terminal apparatus side, a frequency divider 101b, and a buffering unit 101g that buffers the clock signal transmitted to the opposing station side from the terminal apparatus side and multiplies the clock signal by 64.

The framer/digital wrapper LSI 101 also includes an overhead (OH) monitoring unit 101c that processes the input signal from the terminal apparatus side and monitors header information of the telecommunication data, an alarm indication signal (AIS) generating unit 101e that generates an AIS signal by detecting an interruption of the input signal from the terminal apparatus side, and a digital wrapper (DW) unit 101f that adds a channel header and a forward error correction (FEC) before and after a frame of the telecommunication data.

The framer/digital wrapper LSI 101 also includes a decoding-digital wrapper (D-DW) unit 101h that processes the input signal from the opposing station side and removes the channel header and the FEC added before and after the frame of the telecommunication data, an AIS generating unit 101i that generates an AIS signal by detecting an interruption of the input signal from the opposing station side, and an OH monitoring unit 101j that has the same function as the OH monitoring unit 101c.

The framer/digital wrapper LSI 101 also includes a frequency divider 101l that processes the clock signal from the opposing station side, a frequency divider 101m, and a buffering unit 101k that buffers the clock signal transmitted to the terminal apparatus side from the opposing station side and multiplies the clock signal by a predetermined number.

The framer/digital wrapper LSI 101 includes a first in first out (FIFO) buffering unit 101*d* that buffers the input signal and the clock signal from the terminal apparatus side, and the input signal and the clock signal from the opposing station side.

The frequency of the clock signal with the transmission rate of 622.08 megahertz input into the framer/digital wrapper LSI 101 is divided by 8 at the frequency divider 101*a*, and the resulting signal is output to the PLL unit 102 as a clock signal of 77.76 megahertz.

The PLL unit 102 includes an oscillator (OSC) 102*a* that oscillates the clock signal of 77.76 megahertz, a frequency divider 102*b* that divides the frequency of the clock signal oscillated by the OSC 102*a* by 118, a frequency divider 102*c* that divides the frequency of the clock signal of 77.76 megahertz from the framer/digital wrapper LSI 101 by 118, and a selector 102*d* that selects the clock signal from the frequency divider 102*c* under normal conditions, and selects the clock signal from the frequency divider 102*b* when the input signal is interrupted. When the frequency of the clock signal of 77.76 megahertz is divided by 118, a clock signal of 658 kilohertz can be obtained as a PLL reference clock (phase comparison frequency). The PLL reference clock of 658 kilohertz is input into a flip flop (FF) 102*g*.

In the framer/digital wrapper LSI 101, after passing through the FIFO buffering unit 101*d*, the clock signal is subjected to frequency division by 255 by the frequency divider 101*b*. A clock signal of 2.636 megahertz obtained as a result is input into a frequency divider 102*e* of the PLL unit 102. The frequency divider 102*e* divides the frequency of the clock signal of 2.636 megahertz by four, and obtains a clock signal of 658 kilohertz as a slave clock. The frequency of the clock signal of 658 kilohertz is further divided in two by a frequency divider 102*f*, and input into each of the FF 102*g* and a NAND gate 102*h*.

The clock signal from the FF 102*g* is fm, and the clock signal from the frequency divider 102*f* is fs, and the NAND gate takes the NAND of the both, and inputs the result into a low pass filter (LPF) 102*i*. The LPF 102*i* takes out only a specific frequency portion from the input clock signal, and inputs into a voltage controlled crystal oscillator (VCXO) 102*j*. The VCXO 102*j* adjusts the clock signal according to the specific frequency portion of the clock signal supplied as an input, and outputs the resulting clock signal of 672.163 megahertz to the framer/digital wrapper LSI 101.

Because the processing of the input signal from the opposing station side in the optical transmission apparatus 100 is substantially the same as the processing of the input signal from the terminal apparatus side, the descriptions thereof will not be repeated.

The conventional optical apparatus 100 suffers from a problem of prolonged error time of a main signal (communication data) at the switching of PLL reference clock. Specifically, the switching is carried out at a low-speed frequency of 658 kilohertz, with the transmission rate of 39.813 Gb/s. Accordingly, the phase shift at the switching is large. The phase shifts by ±759.7 nanoseconds at the maximum from the PLL reference clock. Subsequently, the phase of the output data of 43 Gb/s shifts by 32,700 bits at the maximum.

Figure 2:
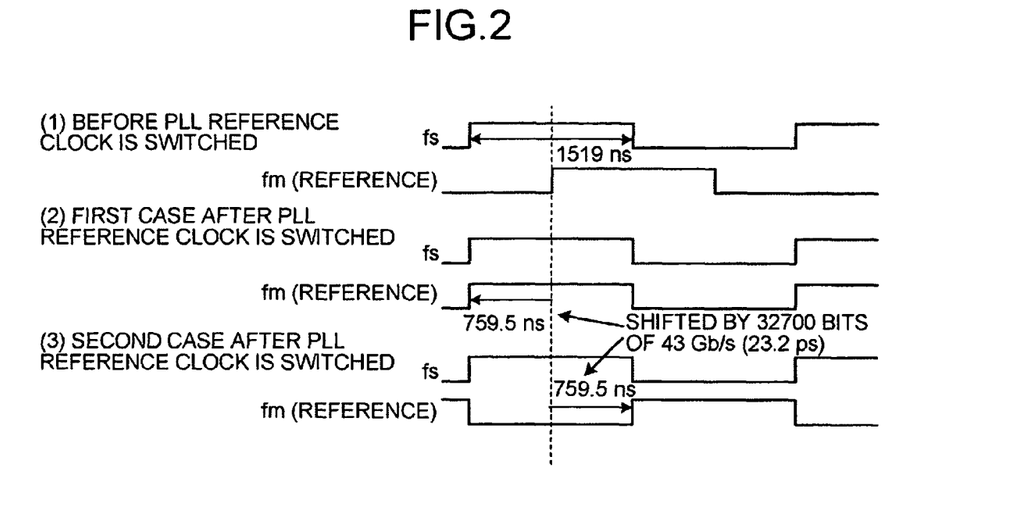
FIG. 2 is a schematic diagram of a clock signal before and after a reference clock is switched, when an optical input is interrupted in the conventional optical transmission apparatus.

In other words, because one cycle of 658 kilohertz is 1,519 nanoseconds (see a timing chart (1) shown in FIG. 2, before the PLL reference clock is switched), the shift is approximately ±759.5 nanoseconds at the maximum (see a timing chart (2) shown in FIG. 2, of a first case after the PLL reference clock is switched, and a timing chart (3) shown in FIG. 2, of a second case after the PLL switching clock is switched).

In this case, phase shift of the output data is represented by 43 Gb/s×759.5 nanoseconds=approximately 32,700 bits at the maximum.

Figure 3:
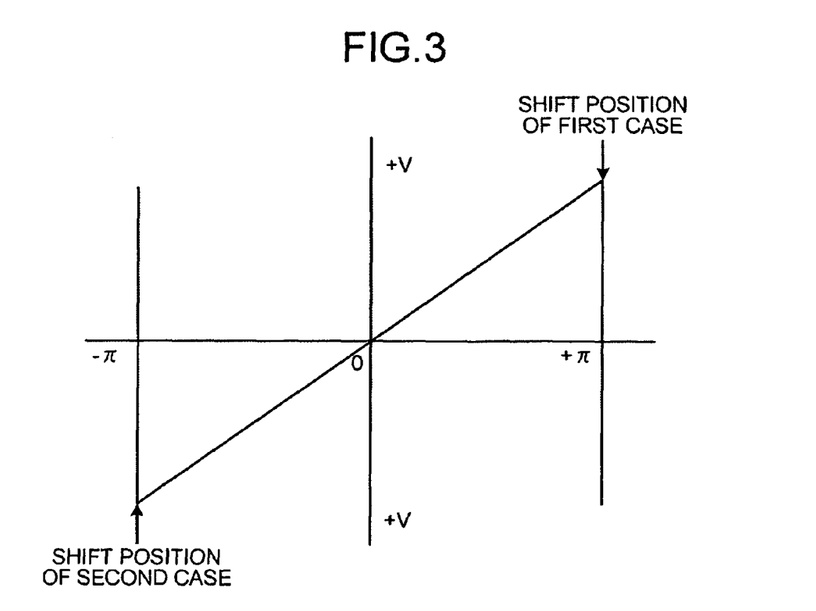
FIG. 3 is a schematic graph of a phase shift of the clock signal after the reference clock is switched, when the optical input is interrupted in the conventional optical transmission apparatus.

As shown in FIG. 3, when the PLL reference clock needs to be pulled in according to the timing chart (2) shown in FIG. 2, with the first case after the PLL reference clock is switched, the phase need to be pulled in by +π [deg]. When the PLL reference clock needs to be pulled in according to the timing chart (3) shown in FIG. 2, with the second case after the PLL reference clock is switched, the phase needs to be pulled in by −π [deg].

It takes a long time to pull in the switched PLL reference clock, after the lock of the PLL unit 102 of the transmitter optical transmission apparatus 100 is released. Moreover, the time that an error occurs at the next opposing station side is prolonged, because a clock data recovery (CDR) of 43 Gb/s of the optical transmission apparatus 100 in the next opposing station side exceeds an acceptable range. The same applies when the input signal is normally recovered.

When the time that an error occurs is prolonged, it also affects the line switching time between an active system and a non-active system of the optical transmission apparatus whose transmission line has a redundant configuration. Because of the constraint of the time after an abnormality is detected in the transmission line until the error is eliminated from the main signal by switching the transmission line, the time that an error occurs because of the switching of the PLL reference clock needs to be suppressed as much as possible.

First Embodiment

Figure 4:
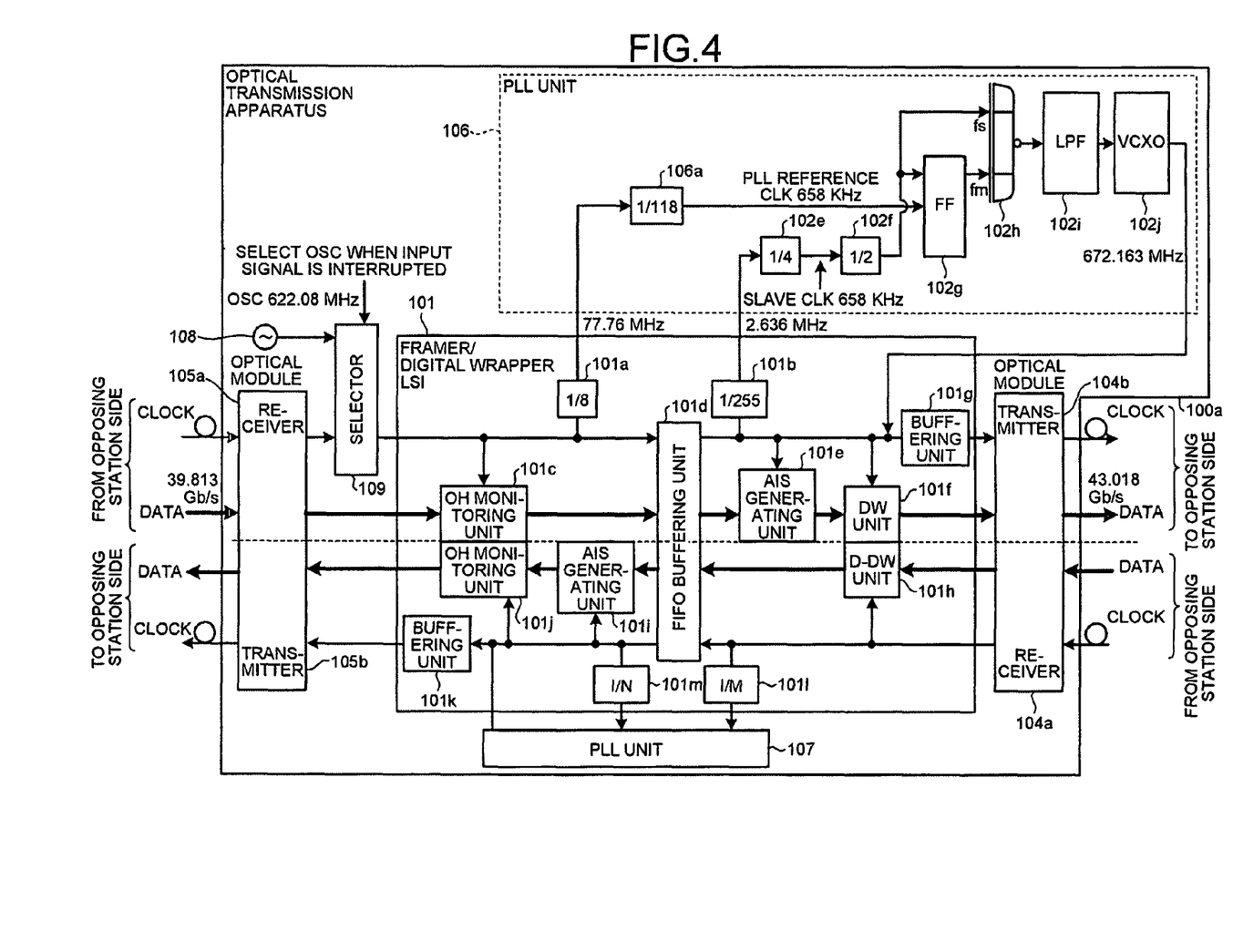
FIG. 4 is a functional diagram of an optical transmission apparatus according to a first embodiment of the present invention.

A first embodiment according to the present invention will now be explained with reference to FIGS. 4 to 6. A configuration of an optical transmission apparatus according to the first embodiment is explained at first. FIG. 4 is a functional block diagram of the optical transmission apparatus according to the first embodiment. Of the configuration of an optical transmission apparatus 100*a* according to the first embodiment, only the difference from the conventional optical transmission apparatus 100 will be explained.

The optical transmission apparatus 100*a* includes a selector 109 between the receiver optical module 105*a* and the framer/digital wrapper LSI 101. The optical transmission apparatus 100*a* includes an oscillator (OSC) 108 that inputs a clock signal of 622.08 megahertz into the selector 109. Triggered by the interruption of the input signal, the selector 109 switches the input from a clock signal converted into telecommunication data at the receiver optical module 105*a* and frequency-divided to 622.08 megahertz, to a clock signal of 622.08 megahertz from the OSC 108.

The optical transmission apparatus 100*a* also includes a PLL unit 106 instead of the PLL unit 102 of the optical transmission apparatus 100, and a PLL unit 107 instead of the PLL unit 103 thereof. Because the PLL unit 107 has approximately the same configuration and functions as those of the PLL unit 106, the descriptions thereof will not be repeated.

The PLL unit 106 does not include the OSC 102*a*, the frequency divider 102*b*, the frequency divider 102*c*, and the selector 102*d* included in the PLL unit 102. Instead, the PLL unit 106 includes a frequency divider 106*a* that divides the frequency of the clock signal whose frequency is divided by 8 by the frequency divider 101*a* of the framer/digital wrapper LSI 101, further by 118. The clock signal after the frequency division in the frequency divider 106*a* is a PLL reference clock (phase comparison frequency) of 658 kilohertz, and input into the FF 102*g*. Because the other configurations and the subsequent processes are the same as those of the PLL unit 102, the descriptions thereof will not be repeated.

At this time, the phase shift in the output data of 43 Gb/s is 34 bits at the maximum. In other words, because one cycle of 622.08 megahertz is 1.607 nanoseconds (see a timing chart (1) shown in FIG. 5, before the PLL reference clock is switched), the phase shift is by approximately ±0.8 nanosecond at the maximum (see a timing chart (2) shown in FIG. 5, of a first case after the PLL reference clock is switched, and a timing chart (3) shown in FIG. 5, of a second case after the PLL reference clock is switched). Accordingly, the phase shift of the output data of 43 Gb/s is only by 43 Gb/s×0.8 nanosecond=approximately 34 bits at the maximum.

Figure 5:
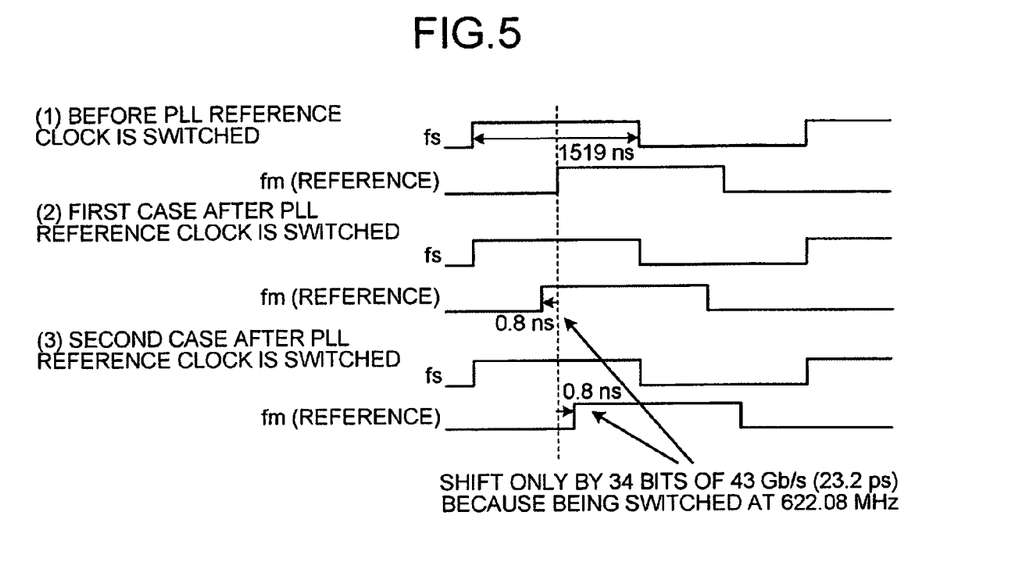
FIG. 5 is a schematic diagram of a clock signal before and after a reference clock is switched, when an optical input is interrupted in the optical transmission apparatus according to the first embodiment.
Figure 6:
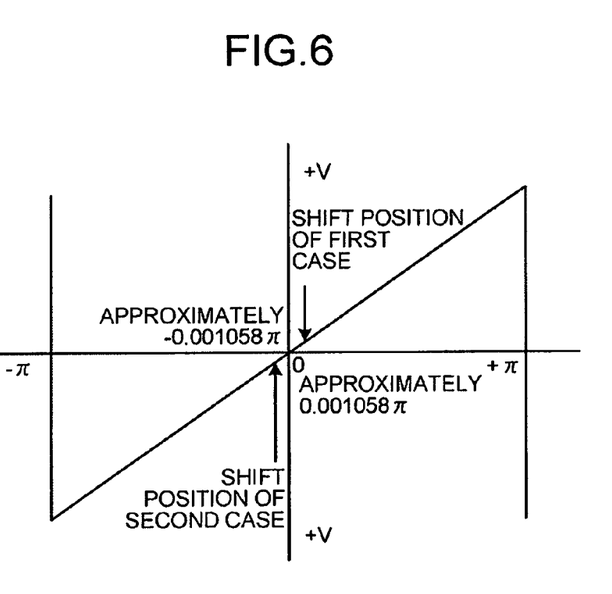
FIG. 6 is a schematic graph of a phase shift of the clock signal after the reference clock is switched, when the optical input is interrupted in the optical transmission apparatus according to the first embodiment.

As shown in FIG. 6, when the PLL reference clock needs to be pulled in according to the timing chart (2) shown in FIG. 5, with the first case after the PLL reference clock is switched, the phase only needs to be pulled in by +(1.607 nanoseconds÷1,519 nanoseconds)π=approximately +0.001058π [deg] at the maximum. When the PLL reference clock needs to be pulled in according to the timing chart (3) shown in FIG. 5, with the second case after the PLL reference clock is switched, the phase only needs to be pulled in by −(1.607 nanoseconds÷1,519 nanoseconds)π=approximately −0.001058π [deg] at the maximum. The approximate of ±0.001058π [deg] is much smaller than ±π [deg], that is, the maximum value of the phase shift of which the conventional optical transmission apparatus 100 requires to pull in the phase. Accordingly, it is possible to pull in the phase shift of the PLL reference clock speedily.

Second Embodiment

Figure 7:
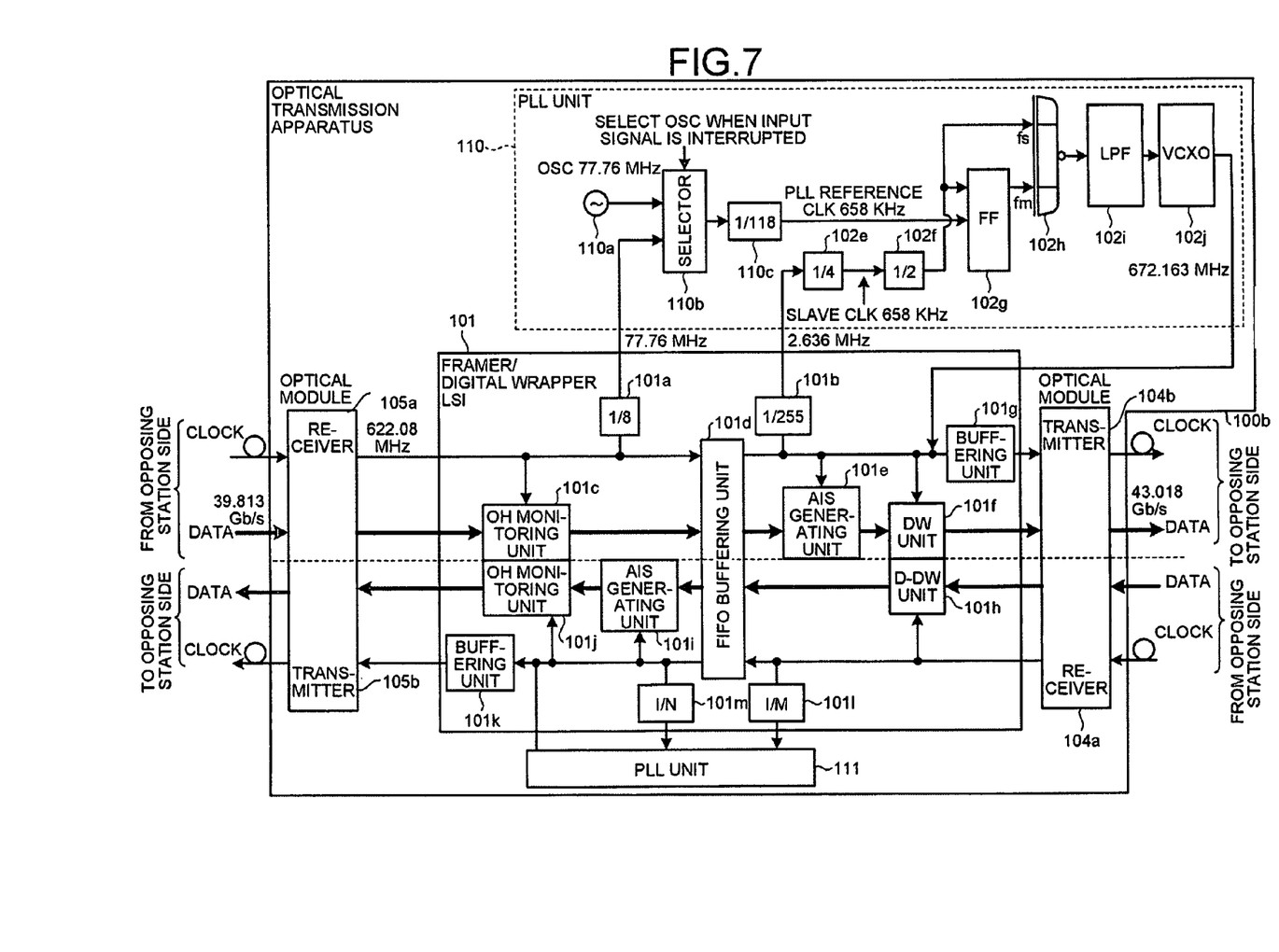
FIG. 7 is a functional block diagram of an optical transmission apparatus according to a second embodiment of the present invention.

A second embodiment according to the present invention will now be explained with reference to FIGS. 7 to 9. A configuration of an optical transmission apparatus according to the second embodiment is explained at first. FIG. 7 is a functional block diagram of the optical transmission apparatus according to the second embodiment. With a configuration of an optical transmission apparatus 100b according to the second embodiment, only the difference from the conventional optical transmission apparatus 100 will be explained.

The optical transmission apparatus 100b includes a PLL unit 110 instead of the PLL unit 102 of the optical transmission apparatus 100, and a PLL unit 111 instead of the PLL unit 103 thereof. Because the PLL unit 111 has approximately the same configuration and functions as those of the PLL unit 110, the descriptions thereof will not be repeated.

The PLL unit 110 does not include the OSC 102a, the frequency divider 102b, the frequency divider 102c, and the selector 102d included in the PLL unit 102. Instead, the PLL unit 110 includes an oscillator (OSC) 110a that oscillates a clock signal of 77.76 megahertz, a selector 110b, and a frequency divider 110c. Triggered by the interruption of the input signal, the selector 110b switches the input from a clock signal of 77.76 megahertz converted into telecommunication data at the receiver optical module 105a and subjected to frequency division to 622.08 megahertz, and further to the frequency division by 8 by the frequency divider 101a of the framer/digital wrapper LSI 101, to a clock signal of 77.76 megahertz from the OSC 110a.

The clock signal input from the selector 110b and subjected to frequency division by 118 by the frequency divider 110c is a PLL reference clock (phase comparison frequency) of 658 kilohertz, and input into the FF 102g. Because the other configuration and the subsequent processes are the same as those of the PLL unit 102, the descriptions thereof will not be repeated.

At this time, the phase shift of the output data of 4.3 Gb/s is 276 bits at the maximum. In other words, because one cycle of 77.76 megahertz is 12.86 nanoseconds (see a timing chart (1) shown in FIG. 8 before the PLL reference clock is switched), the phase shift is approximately by ±6.43 nanoseconds at the maximum (see a timing chart (2) shown in FIG. 8, of a first case after the PLL reference clock is switched, and a timing chart (3) shown in FIG. 8, of a second case after the PLL reference clock is switched). At this time, the phase shift of the output data of 43 Gb/s is only by 43 Gb/s×6.43 nanoseconds=approximately 276 bits at the maximum.

Figure 8:
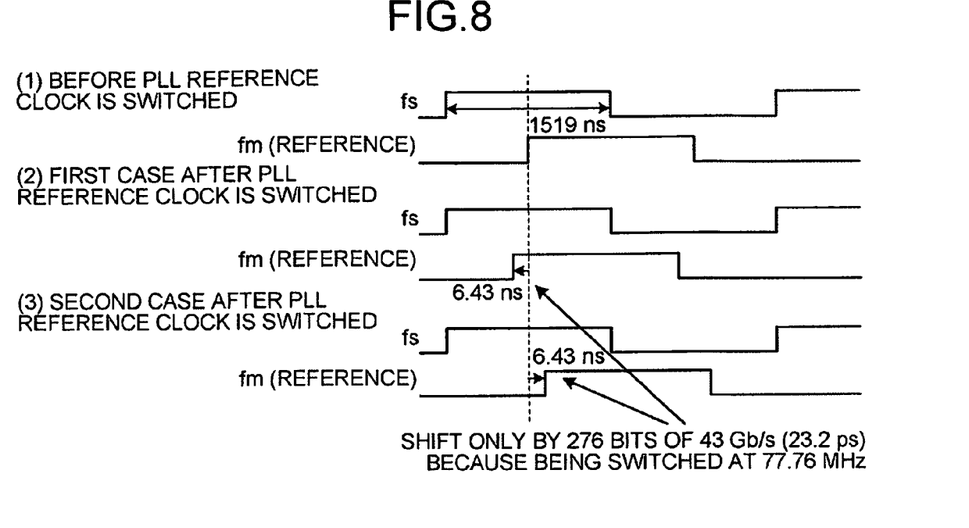
FIG. 8 is a schematic diagram of a clock signal before and after a reference clock is switched, when an optical input is interrupted in the optical transmission apparatus according to the second embodiment.
Figure 9:
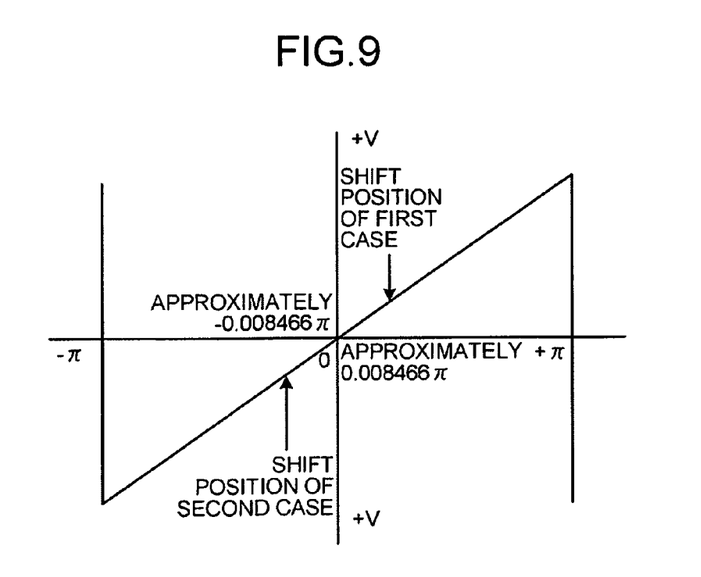
FIG. 9 is a schematic graph of a phase shift of the clock signal after the reference clock is switched, when the optical input is interrupted in the optical transmission apparatus according to the second embodiment.

As shown in FIG. 9, when the PLL reference clock needs to be pulled in according to the timing chart (2) shown in FIG. 8, with the first case after the PLL reference clock is switched, the phase only needs to be pulled in by +(12.86 nanoseconds÷1,519 nanoseconds)π=approximately +0.008466π [deg] at the maximum. When the PLL reference clock needs to be pulled in according to the timing chart (3) shown in FIG. 8, with the second case after the PLL reference clock is switched, the phase only needs to be pulled in by −(12.86 nanoseconds÷1,519 nanoseconds)π=approximately −0.008466π [deg] at the maximum. The approximate of ±0.008466π [deg] is much smaller than the ±π [deg], that is, the maximum value of the phase shift of which the conventional optical transmission apparatus 100 requires to pull in the phase. Accordingly, it is possible to pull in the phase shift of the PLL reference clock speedily.

In the second embodiment, the maximum time required to pull in is longer than that of the first embodiment. Although the number of error bits increases, compared with the first embodiment, the second embodiment has an advantage of reducing the cost of oscillator. This is because the OSC 110a of the second embodiment is a relatively low speed oscillator of 77.76 megahertz, compared with the OSC 108 of the first embodiment, which is a high speed oscillator of 622.08 megahertz.

While the first embodiment and the second embodiment of the present invention are described above, the present invention is not limited to these embodiments, and may be applied to various modifications within the scope of the technical idea as defined by the appended claims. Moreover, the advantages of the first embodiment and the second embodiment are not limited to those described herein.

Figure 10:
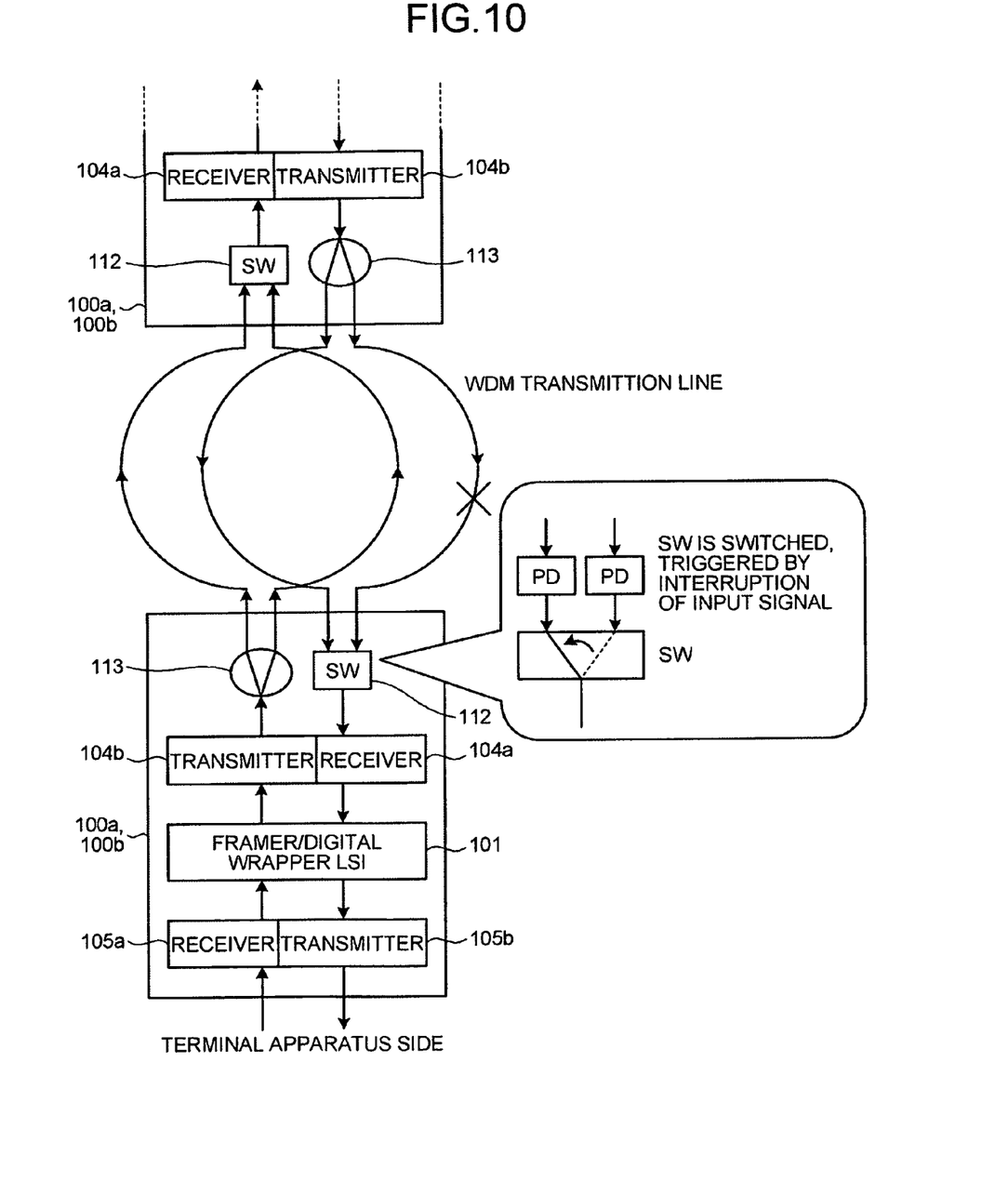
FIG. 10 is a schematic diagram of the optical transmission apparatus according to the first embodiment and the second embodiment, when a transmission line is configured redundantly.

For example, as shown in FIG. 10, the optical transmission apparatus 100a and the optical transmission apparatus 100b may further include a switch (SW) 112 at the WDM transmission line side of the receiver optical module 104a, and a coupler 113 at the WDM transmission line side of the transmitter optical module 104b. Accordingly, the WDM transmission line may be configured redundantly, and the switching time can be reduced, when the WDM transmission line is switched from one to the other, triggered by the interruption of the input signal.

With the processes described in the first embodiment and the second embodiment, all or part of the processes described as being automatically performed may be manually performed, or all or part of the processes described as being manually performed may be automatically performed with a known method. The information that includes the process procedure, the control procedure, specific names, and various kinds of data and parameters shown in the first embodiment and the second embodiment can be optionally changed, unless otherwise specified.

Each of the constituent elements of each apparatus shown in the drawings is functionally conceptual, and need not necessarily be physically configured as shown in the drawings. In other words, the specific mode of dispersion and integration of each apparatus is not limited to the ones shown in the drawings, and all or a part thereof can be functionally or physically dispersed or integrated in an optional unit, depending on the various kinds of load and the status of use.

All or an optional part of the various process functions performed by each apparatus can be realized by a central processing unit (CPU) (or a micro computer such as a micro processing unit (MPU) and a micro controller unit (MCU)), or a program analyzed and executed by the CPU (or the micro computer such as the MPU and the MCU), or can be realized as hardware by wired logic.

According to an embodiment of the present invention, it is possible to advantageously suppress the phase shift, when the clock signal to generate the reference frequency signal is switched. This is enabled by carrying out the switching of the clock signal to generate the reference frequency signal, at the higher frequency before the frequency division, when the input signal is interrupted or switched. Moreover, it is possible to advantageously suppress the time that an error occurs in the communication data at the other transmission apparatus of the receiver side. It is also possible to advantageously reduce the switching time between the active system transmission line and the non-active system transmission line, when the transmission line of the transmission apparatus has a redundant configuration.

According to an embodiment of the present invention, it is possible to advantageously suppress the phase shift when the frequency to generate the reference frequency signal is switched. Moreover, it is possible to advantageously suppress the time that an error occurs in the communication data at the other transmission apparatus of the receiver side. It is also possible to advantageously reduce the switching time between the active system transmission line and the non-active system transmission line, when the transmission line of the transmission apparatus has a redundant configuration.

According to an embodiment of the present invention, it is possible to advantageously suppress the phase shift when the frequency to generate the reference frequency signal is switched. This is enabled by carrying out the switching of the frequency to generate the reference frequency signal at the higher frequency of 622.08 megahertz, than that employed conventionally. Moreover, it is possible to advantageously suppress the time that an error occurs in the communication data at the other transmission apparatus of the receiver side. It is also possible to advantageously reduce the switching time between the active system transmission line and the non-active system transmission line, when the transmission line of the transmission apparatus has a redundant configuration.

According to an embodiment of the present invention, it is possible to advantageously simplify the configuration of the phase locking unit.

According to an embodiment of the present invention, it is possible to advantageously suppress the phase shift when the clock signal to generate the reference frequency signal is switched, and to advantageously suppress the time that an error occurs in the communication data at the other transmission apparatus of the receiver side. These are enabled, while suppressing the cost of the internal fixed frequency oscillator, by carrying out the switching of the clock signal to generate the reference frequency signal, at the higher frequency before frequency division, when the input signal is interrupted or switched. It is also possible to advantageously reduce the switching time between the active system transmission line and the non-active system transmission line, when the transmission line of the transmission apparatus has a redundant configuration.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A transmission apparatus for computer network communication, comprising:
    a phase locking unit that phase locks between an input signal and an output signal corresponding to the input signal based on a reference frequency signal determined by a clock signal obtained;
    an internal fixed frequency oscillator that oscillates a clock signal of a predetermined frequency;
    a switching controlling unit that, when the input signal is interrupted or switched, controls the phase locking unit so as to obtain the clock signal for generation of the reference frequency signal by switching the clock signal from a clock signal of the input signal to the clock signal oscillated by the internal fixed frequency oscillator; and
    a frequency divider that divides the frequency of the clock signal oscillated after the clock signal is switched by the switching controlling unit, and outputs the clock signal to the phase locking unit,
    the internal fixed frequency oscillator outputting the clock signal to the switching controlling unit, triggered by the interruption of the input signal.

2. The transmission apparatus according to claim 1, wherein the predetermined frequency of the clock signal oscillated by the internal fixed frequency oscillator is 622.08 megahertz.

3. The transmission apparatus according to claim 1, wherein the internal fixed frequency oscillator is independent from the phase locking unit.

4. A transmission apparatus for computer network communication comprising:
    a phase locking unit that phase locks between an input signal and an output signal corresponding to the input signal based on a reference frequency signal determined by a clock signal obtained, the phase locking unit including
        an internal fixed frequency oscillator that oscillates a clock signal of a predetermined frequency,
        a switching controlling unit that, when the input signal is interrupted or switched, controls the phase locking unit so as to obtain the clock signal for generation of the reference frequency signal by switching the clock signal from a clock signal of the input signal to the clock signal oscillated by the internal fixed frequency oscillator; and
        a frequency divider that divides the frequency of the clock signal oscillated after the clock signal is switched by the switching controlling unit, and outputs the clock signal,
    the internal fixed frequency oscillator outputting the clock signal to the switching controlling unit, triggered by the interruption of the input signal.

5. The transmission apparatus according to claim 4, wherein the predetermined frequency of the clock signal oscillated by the internal fixed frequency oscillator is 77.76 megahertz.

6. A method of switching a phase lock reference frequency signal in a transmission apparatus, comprising:
    phase locking between an input signal and an output signal corresponding to the input signal based on a reference frequency signal determined by a clock signal obtained;

oscillating a clock signal of a predetermined frequency to generate the reference frequency signal;

controlling, when the input signal is interrupted or switched, to switch the clock signal for generation of the reference frequency signal from a clock signal of the input signal to the clock signal oscillated in the oscillating; and dividing the frequency of the clock signal oscillated after the clock signal is switched in the controlling, and outputting the clock signal, the oscillating outputting the clock signal to the controlling, triggered by the interruption of the input signal.

* * * * *